United States Patent [19]

Faris

[11] 4,401,900

[45] Aug. 30, 1983

[54] ULTRA HIGH RESOLUTION JOSEPHSON SAMPLING TECHNIQUE

[75] Inventor: Sadeg M. Faris, Yorktown Heights, N.Y.

[73] Assignee: International Business Machines Corporation, Armonk, N.Y.

[21] Appl. No.: 105,674

[22] Filed: Dec. 20, 1979

[51] Int. Cl.³ .................................... H03K 17/92
[52] U.S. Cl. ................................ 307/352; 307/277; 307/306
[58] Field of Search ............. 307/306, 277, 212, 350, 307/352, 363; 365/162

[56] References Cited

U.S. PATENT DOCUMENTS

| | | | |
|---|---|---|---|
| 3,689,780 | 9/1972 | Meissner et al. | 307/306 |
| 3,761,798 | 9/1973 | Silver et al. | 307/306 X |
| 3,764,905 | 10/1973 | Zappe | 307/306 X |
| 3,913,120 | 10/1974 | Lahiri | 307/306 X |
| 3,983,419 | 9/1976 | Fang | 307/277 |

*Primary Examiner*—John Zazworsky
*Attorney, Agent, or Firm*—Jackson E. Stanland

[57] ABSTRACT

A circuit is provided for sampling and accurately reproducing unknown signals with picosecond resolution, which could be electrical, optical, X-ray, gamma ray, or particle signals. The circuit comprises a superconductive monitor gate having at least two states which are distinguishable from one another. The monitor gate could be, for example, comprised of a Josephson device or a superconducting quantum interference device (SQUID). Switching means, including a source of the unknown signal, are provided to switch the state of the monitor gate. This switching means includes a sampling pulse source and a bias current source which are combined with the unknown signal to change the state of the monitor gate. A noise elimination means is also provided including a lock-in amplifier, a comparator, and a feedback loop. A time averaging technique eliminates any incorrect indications resulting from noise. A timing means establishes a timing reference and sampling delay, and includes the sampling pulse source, delay lines, and a trigger pulse source connected to the source of the unknown signal and to the sampling pulse source. A display, such as an x-y recorder or oscilloscope, indicates the unknown signal. The circuit has applications in all devices where fast unknown waveform must be measured exactly, and in the field of non-equilibrium superconductivity, where exceptionally high resolution and sensitivity are required.

20 Claims, 11 Drawing Figures

ULTRA HIGH RESOLUTION JOSEPHSON SAMPLING TECHNIQUE

DESCRIPTION

Technical Field

This invention relates to a method and apparatus for high speed, ultra high resolution sampling and recording of general unknown signals and more particularly to a circuit using a superconductive monitor gate, such as a Josephson device, together with noise elimination means and timing means to establish a very high resolution, very sensitive sampling circuit.

BACKGROUND ART

The use of superconductive devices, and particularly Josephson tunnelling devices, in sampling or A/D circuits is known in the art, as exemplified by U.S. Pat. Nos. 3,983,419 (Fang) and 3,764,905 (Zappe). Because a Josephson device is capable of extremely fast switching speed between two stable states, and because the device responds to extremely small magnetic fields, use of a Josephson device provides a very sensitive detector offering the possibility of very fast sampling speeds, To date, Josephson sampling circuits are among those providing the highest resolution, because of these advantages. U.S. Pat. No. 3,983,419 describes a sample and hold technique in which a single Josephson junction device is utilized, and provides an extensive discussion of the background for use of Josephson tunnelling devices in sampling circuits. The Josephson device in that patent is connected in a superconductive loop containing distributed inductance. A control loop is used to switch the Josephson device between its zero voltage state and its finite voltage state.

In U.S. Pat. No. 3,764,905, another sample and hold circuit is described in which two Josephson junctions are used, where each is connected in a superconductive loop. A first loop captures magnetic flux quanta from the unknown signal during a predetermined amount of time. When the Josephson device in the first loop is switched to its zero voltage state, the flux penetrating the loop is trapped and a current will flow in the superconductive loop. This persistent current is used as a control current to switch the state of a test Josephson device in a second loop in order to read the amount of flux quanta (and thereby the amplitude) due to the unknown signal.

These approaches to unknown signal measurement rely upon sampling of the signal and trapping magnetic flux in a superconducting loop containing a Josephson junction device. In such an approach, it is desirable that the acquisition time (i.e., the time required for the superconducting circuit to be updated to the current value of the sampling current) be sufficiently fast that the measured signal can accurately track the applied analog signal. The L/R time constant of the superconducting loop is the primary determinent of the acquisition time. Additionally, the integrity of such a system depends on the design of each loop, since it is often possible to switch the state of one loop while not switching the state of another loop which was intended to be switched. Still further, these approaches require commercial sampling oscilloscopes and high speed cables, which affect the resolution of these circuits.

Another disadvantage of these circuits is that the unknown signal must cross several loops which causes degradation of the signal. Also, trapped flux quanta from previous sampling cycles can present uncertainty. Noise and random events can cause loops to switch in a random fashion rather than in a preselected, well defined sequence.

In order to provide a sample and hold technique in which the critical time is not that for magnetic flux to penetrate a loop, C. A. Hamilton has proposed an approach which does not require a superconducting loop. This approach is described in more detail in copending application Ser. No. 853,354, filed Nov. 21, 1977, and also described in a bulletin NTN 78/0328, "High-Speed Analog Current Sampler," provided by the National Technical Information Service of the U.S. Department of Commerce, and in Applied Physics Letters 35, 718 (1979).

In the Hamilton circuit, superconducting loops are not used to trap magnetic flux from an unknown signal. Instead, a first Josephson device is used to produce very short sampling pulses and a second Josephson device acts as a latching type amplitude discriminator. The short output pulse from the first Josephson device is used as a control current to change the state of the second Josephson device, through which the unknown electrical signal passes as a gate current. A bias current is used as a control signal along with a sampling pulse. The bias current is increased or decreased with each short trigger pulse until the sum of the bias current and the trigger pulse is enough to change the state of the second Josephson device. Since the maximum Josephson current through the second Josephson device and the sampling pulse current have constant amplitudes, the magnitude of the bias current is related to the magnitude of the unknown signal.

The circuit of Hamilton is limited by the fact that many samples must be made at a given point in a repetitive waveform in order to resolve the analog signal level as that point. This is stated to be a design choice, because it is considered that a short acquisition time is more important than minimizing the number of required samples.

In that circuit, a sampling oscilloscope is used to establish a time reference since none is provided by the circuitry itself. This means that the resolution and sensitivity of the system are dependent upon that of the commercial sampling oscilloscope and, consequently, there is little improvement over the prior art. Further, since an oscilloscope is required, special, high speed coaxial cables are also required to deliver the output of the second Josephson device to the oscilloscope. Since these cables tend to degrade the output signal due to dispersion of different frequencies of the signal, the resolution and sensitivity of that system are limited. For example, the sensitivity is limited by the sensitivity of the commercial sampling oscilloscope. This means that the second Josephson device is constrained to provide an output in the millivolt range in order to be detectable by the oscilloscope. In turn, this means that the monitor gate cannot be made extremely small to minimize its resistance and capacitance in order to provide the fastest switching of the monitor gate. Still further, that circuit can measure only rise time, rather than both rise and fall times.

The circuit of Hamilton also does not provide for noise cancellation in order to eliminate inaccurate signals due to random events, such as those due to stray magnetic fields. Moreover, it would be difficult to do so, since the step bias approach used therein makes it very difficult to use an averaging scheme to eliminate noise. Noise cancellation is required for ultra high accuracy and it is preferable to provide it in a self-contained circuit in order to more accurately track the unknown signal, and to define the switching threshold unambiguously.

Accordingly, it is an object of the present invention to provide a sampling technique in which high speed cables and conventional sampling oscillations are not required.

Hamilton's circuit requires two pulse generators which have to be designed with tight tolerances, in order to prevent unwanted state switching of the second Josephson device (monitor gate). In that circuit, the trigger pulse applied to the first Josephson device must be of very short duration and of fixed amplitude, otherwise more than one sample pulse may be produced in response to a simple trigger pulse. High speed cables are also required on the input of this circuit. Further, the first Josephson device may produce different sample pulses in response to different trigger pulses, which also adversely affects circuit integrity. Still further, the monitor gate may not latch in its voltage state if the unknown signal is reversed rapidly and if the trigger pulse is not present.

In the design of an ultra fast sampling system, it is important that the switching threshold of the monitor gate be unambiguously defined, and that the resolution and sensitivity not be limited by the necessity to use commercially available equipment. Also, it is advantageous if the trigger pulse generator does not require tight tolerances, and if the system will measure both rising and falling portions of the unknown signal.

It is another object of the present invention to provide a simple sampling technique in which accurate picosecond resolution can be obtained without the need for additional fast and expensive instrumentation, and which can be extended to sub picosecond resolution.

It is another object of the present invention to provide a superconductive method and apparatus which can measure the amplitude and shape of any unknown waveform, including electrical signals, optical signals, X-ray signals, gamma ray signals, or even particle signals.

It is still another object of the present invention to provide a Josephson device sampling circuit having a timing means to establish a timing reference for the start of a measurement sample and for establishing the sampling delay times, without relying on conventional room temperature sampling means.

It is yet another object of the present invention to provide an improved Josephson device sampling circuit using presently available components and which also includes noise elimination means and timing means for establishing a timing reference.

It is another object of the present invention to provide an ultra high resolution sampling system which can accurately sample and record the rise and fall of general unknown signals.

DISCLOSURE OF INVENTION

The sampling technique of the present invention uses a superconductive monitor gate, such as a single Josephson device or a superconductive quantum interference device (SQUID) which has two distinguishable states and is sensitive to the unknown signal to be sampled and reproduced. The superconducting monitor gate is responsive to excitation by many unknown waveforms, and is not restricted to the sampling and reproduction of only electrical waveforms. It is current biased so it can operate in a latching or non-latching mode.

Switching means is provided for changing the state of the monitor gate, where the switching means includes the source of the unknown signal or waveform. The switching means also includes a source of very short timing pulses and a source of a bias signal, the amplitude of the bias signal being related to the amplitude of the unknown signal if the amplitudes of the timing pulses are constant and if the switching threshold of the monitor gate is constant. For example, a Josephson junction device will change from a zero voltage state to a finite voltage state by a proper combination of the unknown signal, the timing pulse signal, and the bias signal.

At any instant of time, the repetitive unknown signal is sampled a plurality of times. A noise elimination means including a lock-in amplifier, a comparator, and a feedback loop is used to ensure that the bias signal (which is proportional to the amplitude of the unknown signal) accurately represents the amplitude of the unknown signal. A time averaging technique is used to eliminate the effects of noise on the switching of the monitor gate in order to ensure accuracy of the sample at any given instant of time. Thus, the switching threshold is very well defined in spite of the presence of random events. This averaging means is crucial to the realization of ultra high resolution.

A timing means is provided to establish both a timing reference and an accurate sampling delay time. This timing means includes a pulse generator for providing very short sampling pulses, delay lines, and a source of trigger pulses. The trigger pulses are delivered to the circuit providing the unknown waveform or signal, and also to the pulse generator which provides the short sampling pulses. In this manner, the start of the timing measurement is known, as is the delay time between successive samples. Since the circuit being investigated and the timing pulse generator are triggered by the same trigger pulse, jitter is minimized, and the unknown waveform can be repeatedly sampled at the same instant of time in order to allow time averaging to eliminate noise effects. Furthermore, this timing circuitry provides an accurate measure of the time interval between sampling transitions with sub picosecond accuracy. The timing circuitry eliminates the need for very expensive sampling oscilloscopes, and their associated coaxial high speed cables.

A display means provides an indication of the unknown waveform. Any conventional display can be used, including an x-y recorder or oscilloscope.

These and other objects, features and advantages will be apparent from the following more particular description of the preferred embodiments.

BEST MODE FOR CARRYING OUT THE INVENTION

Basic Sampling Circuit (FIGS. 1-4)

Figure 1:
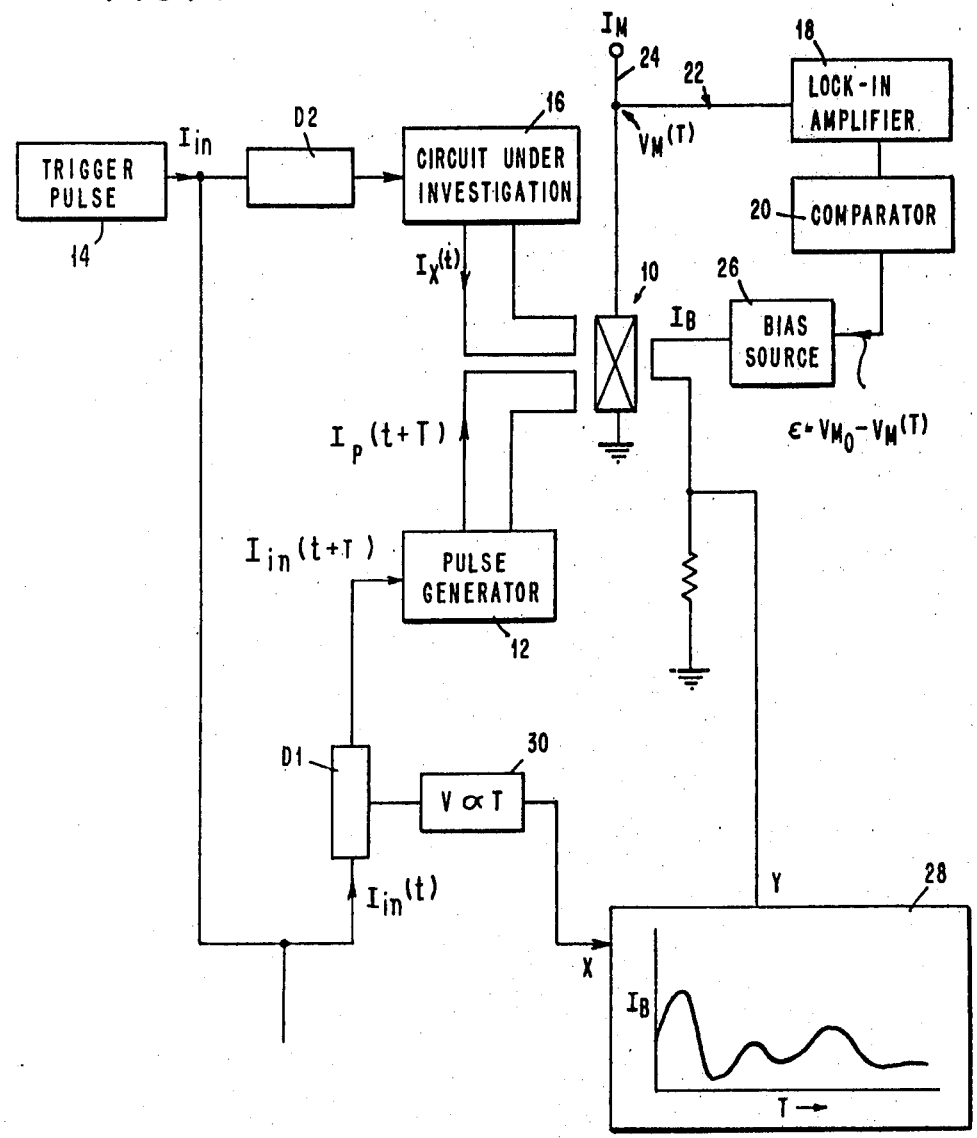
FIG. 1 is a schematic diagram of the Josephson sampling apparatus of the present invention.

FIG. 1 is a schematic diagram of the Josephson sampling circuit of the present invention. It is comprised of a monitor gate 10 that responds to an unknown signal, a sampling pulse signal, and a bias current in order to change its voltage state. Monitor gate 10 is a threshold device which will change its state when the algebraic sum of these three inputs exceeds a threshold value. Since the threshold is a constant amplitude, the value of the bias current will track the amplitude of the unknown signal, if the amplitude of the sampling pulses is constant. In this manner, the unknown signal can be reconstructed in both amplitude and shape. As noted, the circuit of FIG. 1 will provide complete and accurate reconstruction of the unknown signal, including both rise time and fall time increments of that signal.

The circuit of FIG. 1 includes a timing means for establishing both a timing reference and a variable sampling delay. Thus, an external room temperature sampling scope is not required, which eliminates the problem of limited resolution and sensitivity of such a sampling scope and the dispersion due to the associated high speed cables. The timing means is broadly comprised of a sub picosecond pulse generator 12 which provides the narrow sampling pulses $I_p(t+T)$, where T is a delay time, a delay D1, and a trigger pulse source 14. Trigger pulse source 14 also provides an input to the circuit or device 16 which is under investigation (i.e., the circuit or device which provides the unknown waveform $I_x(t)$. Circuit or device 16 is provided with a trigger pulse $I_{in}$ through another adjustable delay D2. In this manner, the onset of the unknown waveform $I_x(t)$ and the sampling pulse $I_p(t+T)$ can be adjusted.

A noise elimination means is also provided to time average the results of a multiple number of samplings at each particular sampling time. This circuit averages out time jitter and noise in all the circuit elements in order to eliminate any random events which could adversely affect resolution. Broadly the noise elimination means is comprised of a lock-in amplifier 18, a comparator 20, and a feedback loop 22 that is connected to the conductor 24 which provides the constant gate current $I_M$ through monitor gate 10. Feedback loop 22 is also connected to a bias source 26, which provides bias current $I_B$ to the monitor gate 10.

As will be explained in more detail later, the comparator 20 provides an error signal $\epsilon$ which automatically minimizes error by adjusting the bias current $I_B$ to average out any effects of noise.

A display unit 28, which could be an x-y recorder, is used to display a replica of the unknown signal $I_x(t)$. In FIG. 1, the bias current $I_B$ is connected to the Y channel while a voltage proportional to the sampling delay T is provided by source 30 to the X channel of display 28.

In the circuit of FIG. 1, an expensive room temperature sampling oscilloscope is not required for establishment of a time reference, nor are any high speed coaxial cables required for propagating signals from a cryogenic environment to a room temperature environment. Further, the resolution of the circuit is limited only by the width of the sampling pulses $I_p(t+T)$ and by the speed of response of the monitor gate 10. Further, the circuit will measure not only the rise time of the unknown signal $I_x(t)$, but also the fall time of these signals. Still further, the monitor gate 10 can comprise a single Josephson device of very small dimensions in order to minimize resistance and capacitance. A large output signal (in the range of millivolts) is not required as is the situation when a commercial sampling oscilloscope is required. The lock-in amplifier can measure extremely small signals, and the time averaging noise elimination scheme means that a very accurate representation of the amplitude of the unknown signal is provided at all sampling times.

Figure 2:
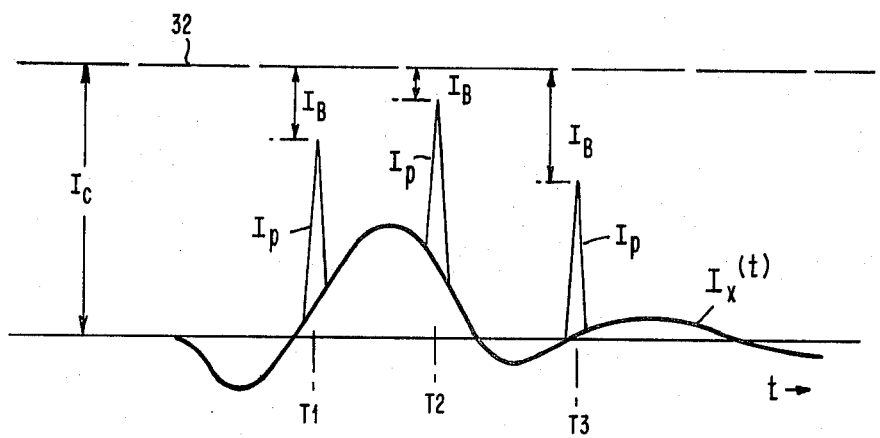
FIG. 2 illustrates the reconstruction of an unknown signal $I_x(t)$ by the bias current $I_B(T)$. The critical current for switching the state of the monitor gate is $I_c$ while the sampling pulses are $I_p(t+T)$.
Figure 3:
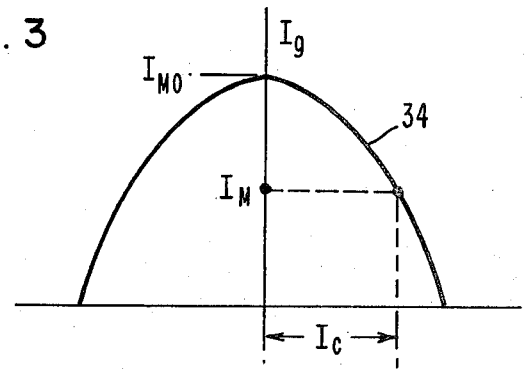
FIG. 3 is a gain curve of the monitor gate which plots the maximum Josephson gate current $I_g$ along the vertical axis and the control current $I_c$ along the horizontal axis. The area within the curve is the zero voltage state of the monitor gate, while the area outside of the curve is the finite voltage state.
Figure 4:
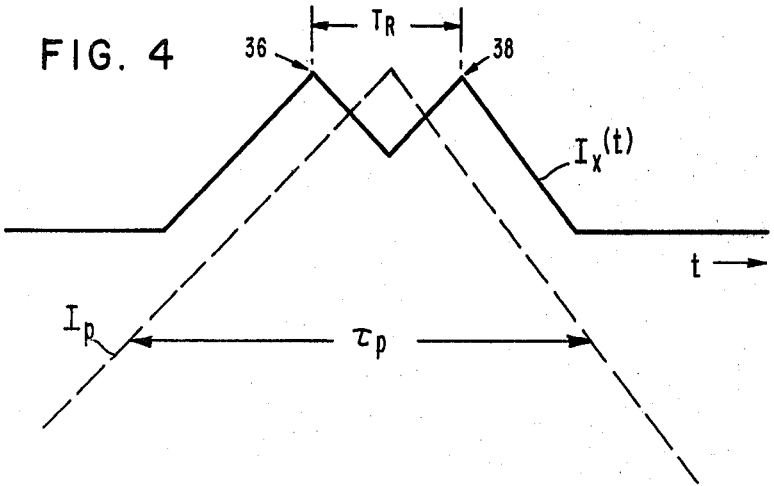
FIG. 4 shows a sample pulse $I_p$ and an unknown waveform $I_x(t)$ and illustrates the accuracy with which two peaks in the unknown signal $I_x(t)$ can be reconstructed by this sampling technique.

Reconstruction of $I_x(t)$ by $I_B(T)$ (FIGS. 2-4)

FIG. 2 illustrates the algebraic sum of the amplitude of the unkown waveform $I_x(t)$, the sample pulse waveform $I_p(t+T)$, $T=T1, T2, T3, \ldots$, and the bias current $I_B(T)$. The total control current $I_c$ required to switch the state of the monitor gate 10 is a constant as indicated by the dashed line 32.

In FIG. 3, the threshold curve for monitor gate 10 is shown. This is a plot of the gate current $I_g$ through monitor gate 10, as a function of the total control current $I_c$. Thus, curve 34 indicates the maximum Josephson current which can flow through monitor gate 10 for different values of the total control current $I_c$. For $I_c=0$, a maximum Josephson current $I_{M0}$ will result.

As shown in FIG. 3, the gate current $I_g$ through the monitor gate 10 is held at a fixed value $I_g=I_M$. This means that a predetermined control current $I_c$ will be required to switch the state of monitor gate 10 and, since the gate current $I_g=I_M$ is a constant, the control current $I_c$ required to switch the gate is also a constant.

In the circuit of FIG. 1, the total control current $I_c$ applied to switch the state of monitor gate 10 is given by $$I_c = I_x(t) + I_p(t+T) + I_B(T) \tag{1}$$

Since $I_p$ has constant amplitude, the amplitude of $I_B$ is related to the amplitude of the unknown waveform $I_x(t)$. Since the amplitude of the bias current $I_B$ is known at any sampling time T=T1, T2, T3, etc., the amplitude of $I_x$ at these times is therefore also known. Further, since the sample pulses $I_p$ can be made extremely narrow (sub picosecond width) and because the resolution of the delay lines is extremely high, the sampling interval $\Delta T=(T2-T1)$ etc. can also be made extremely small. This will be more apparent with respect to FIG. 4.

In the reconstruction of the unknown signal $I_x$, the bias current can be applied in such a manner to oppose or aid the magnetic fields due to the unknown signal $I_x$ or the sampling pulses $I_p$. Since the net control current $I_c$ required to switch monitor gate 10 is constant, $I_B$ will always track $I_x$.

FIG. 4 illustrates the resolution that can be obtained by the present technique. This figure shows the unknown waveform $I_x(t)$, having two peaks 36 and 38 therein which are to be resolved by the sampling technique. A sampling pulse $I_p$ is also shown, having a duration $\tau_p$. In this system, fast waveform measurements can be made with a resolution time $T_R$ given by $$T_R \approx \tau_p I_x / 2 I_p \quad (2)$$

Thus, if $I_x$ has two peaks 36 and 38 separated by $\Delta T=T_R$, it can be reconstructed with reasonable accuracy by this technique. The pulse duration $\tau_p$ is roughly equal to $2\sqrt{L_c C_j}$, where $L_c$ is the inductance resulting from crossing a monitor gate and $C_j$ is the capacitance of the pulse generator.

Expression (2) can be rewritten as $$T_R = \sqrt{L_c C_j} \; (I_x/I_p). \quad (3)$$

The numerator of equation (3) is minimized through $L_c$ to obtain smallest $T_R$. This is accomplished by feeding the pulse directly to a monitor gate as will be described with respect to FIG. 5. The monitor gate can be either a single gate or a low gain interferometer. It is important to keep the monitor gate gain as low as possible, to achieve wide dynamic range and the fastest response time of the device. Minimizing the ratio $I_x/I_p$ further improves the resolution. However, the maximum resolution is limited by the speed of response of the monitor gate.

Typical values are $L_c=10$pH, $C_j \approx 1$pF, $I_p=1$mA. These values yield a resolution $T_R$ of 0.3 ps., and 0.15 ps., respectively, for $I_x$ of 0.1mA and 0.05mA.

Circuit Components

The monitor gate 10 has been described in some detail previously, and examples of it will be shown in subsequent figures. As noted, it can be either a single junction having a critical current $I_o$ or an interferometer, a single gate being preferred. Its optimum design favors high current density, which gives low capacitance $C_j$ so that the intrinsic speed of response $h/4\pi\Delta$ is reached (R. E. Harris, Phys. Rev. B13, 3818 (1976). The speed of response is predicted to be ~0.09 ps. using high $T_c$ materials such as Nb$_3$Ge having $2\Delta=7.5$ meV.

Another advantage in using small, single monitor gates is that they give very wide dynamic range because of low gain. That is, they require very large control currents to have their states switched. As noted with respect to FIG. 4, if the response time of the monitor gate is in the sub picosecond range, then the resolution of the system of FIG. 1 can also be in the sub picosecond range.

One example of pulse generator 12 is that described in Faris U.S. Pat. No. 4,144,465. It is preferable that pulse generator 12 produce sub picosecond pulses in order to obtain the best resolution. Generator 12 produces pulses $I_p(t \pm T)$, where T is a variable delay. In this regard, the variable delay lines D1 and D2 can be continuously adjusted to provide very small delay times T. These delay lines can be a commercially available mechanical type or the piezoelectric type. Examples of mechanical delay lines are the adjustable air coaxial lines, or mirror and lens configurations which can be mechanically adjusted by means of a micrometer or differential screw translator. A piezoelectric delay line comprises a crystal whose dimensions can be changed by the application of a voltage thereacross. Of course, the pulse generator 12 can be a type which uses optical triggering or could comprise additional Josephson circuitry.

The trigger pulse source 14 provides either electrical signals and/or optical signals to trigger the pulse generator 12 and the unknown signal generator (circuit under investigation) 16. These components are also synchronized with the current source providing the monitor gate current $I_M$ with the same frequency as that of the reference signal for the lock-in amplifier 18. The variable delay lines D1 and D2 are used to continuously adjust the time relationship between the timing pulse $I_p$ and the unknown signal $I_x$. These delay lines can be either mechanical or piezoelectric, as previously described. Commercially available delay lines provide sub picosecond resolution. The delay line D1 is coupled to a voltage generator 30 which produces a voltage proportional to the delay time T. This voltage is applied to the X-channel of an x-y recorder 28, as is well known in the art.

The noise elimination means utilizes a lock-in amplifier 18 and a comparator 20, in order to average out noise to provide a bias signal $I_B$ which accurately reflects the amplitude and shape of the unknown waveform $I_x$. Amplifier 18 is commercially available and can be any phase sensitive detector or synchronous detector which operates essentially as a narrow bandwidth filter. It measures the voltage $V_M(T)$ across the monitor gate 10 only when it is in phase with a reference signal. This means that random noise signals, being out of phase with the reference signal, are not detected even though they may be of the same frequency as the reference signal. Consequently, lock-in amplifier 18 acts as an extremely narrow bandwidth filter. Bandwidths of less than 0.01 Hz can be achieved and hence noise, which is proportional to the bandwidth, can be suppressed.

The noise elimination scheme enables the circuit of FIG. 1 to achieve sub picosecond resolution. Time jitter and noise in all the circuit elements are averaged out by the lock-in amplifier. For example, if the repetition rate of the sampling technique for trigger frequency is assumed to be 500 MHz and the lock-in amplifier bandwidth is 1 Hz, averaging over $5 \times 10^8$ samples is achieved so that the effects of any random events are eliminated.

Comparator 20 compares the voltage $V_M(T)$, where T is any sampling time T1, T2, T3, etc., detected by lock-in amplifier 18 with a fixed reference voltage $V_{M0}$ in order to produce an error signal $\epsilon = V_{M0} - V_M(T)$. The error signal $\epsilon$ is fed back to bias current source 26 to readjust the bias current $I_B$ until $\epsilon=0$. When this is done, the fixed switching threshold of monitor gate 10 is always reached unambiguously and unaffected by random events.

$V_{M0}$ is set without application of the unknown signal $I_x$. Since $I_p$ is known, and since $I_B=I_c-I_p$ when $I_x=0$, the gate current $I_M$ through monitor gate 10 is adjusted so that gate 10 will switch to its voltage state when $I_p=I_c$. The voltage across monitor gate 10 at that time is $V_{M0}$ whether or not gate 10 switches due to noise since $I_B$, and the other waveforms $I_p$, $I_c$, and $I_x$, are averaged over many cycles to eliminate the effects of noise or random events.

It is assumed that the signal $I_x(t)$ is a repetitive signal and can be sampled at the same instant of time over many cycles in order to average out an incorrect reading. After each cycle, monitor gate 10 is reset by turning off the gate current $I_M$. The delay T is then changed and another sampling point taken over many cycles. This continues until the entire waveform $I_x(t)$ is plotted. The shape of $I_x(t)$ is known in addition to its exact amplitude, since $I_c$ is the algebraic sum of $I_x$, $I_p$, and $I_B$. As will be explained later, for non-electrical unknown waveforms, a calibration factor has to be known in order to know the exact amplitude of the unknown signal. That is, it must be known how the gap of the Josephson monitor gate 10 varies with the input excitation in order to relate the magnitude of $I_B$ to the amplitude of the unknown excitation.

Comparator 20 is also a commercially available component, as is the bias source, lock-in amplifier, and delay lines D1 and D2. These components are readily available and are for example, Tektronix 7013 plug-in comparator, which can be used with a Princeton Applied Research PAR-8 lock-in amplifier and a "trombone" stretcher delay line of the type sold by Microlab (ST-24). The bias source can be a battery with an appropriate potentiometer. Of course, all of these components can be easily integrated onto a single circuit chip.

Figure 5:
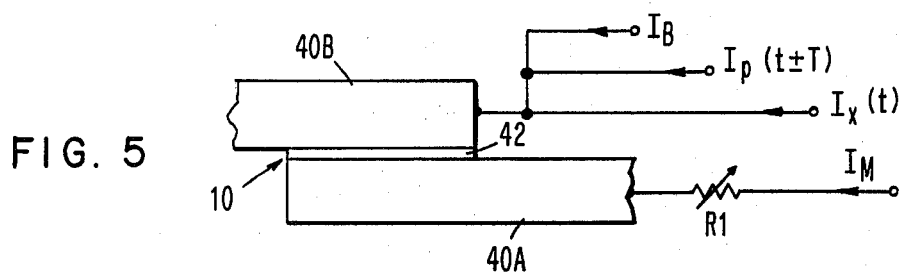
FIG. 5 shows a directly controlled monitor gate in which the bias signal $I_B$, the sampling pulse $I_p$, and the unknown signal $I_x$ are directly coupled to one electrode of a single monitor gate.
Figure 6:
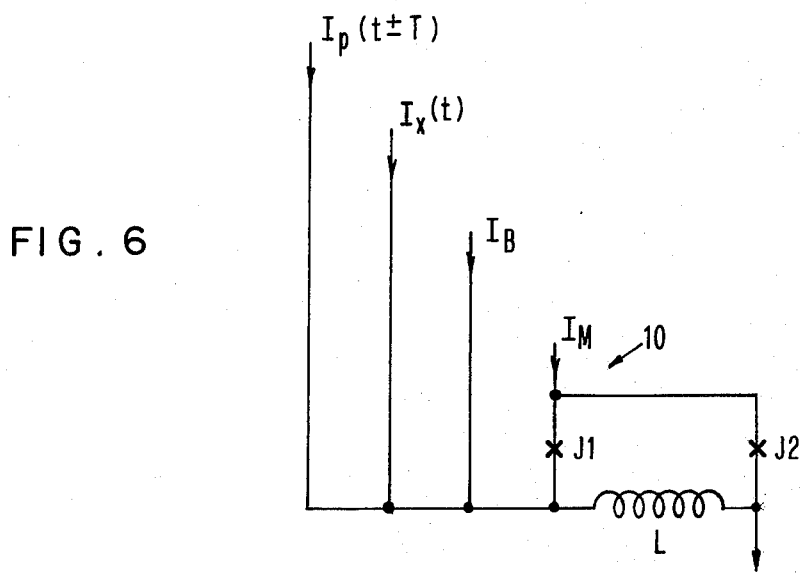
FIG. 6 shows the direct coupling of $I_p$, $I_B$, and $I_x$ to a monitor gate comprised of two Josephson devices connected in a superconducting loop.

Directly Controlled Monitor Gate (FIGS. 5 and 6)

As will be remembered, the resolution obtainable by the circuit of FIG. 1 is maximized if the numerator of equation 3 is minimized through the inductance $L_c$. This is accomplished by feeding the pulse $I_x$ directly to the monitor gate, as shown in FIG. 5. Here, monitor gate 10 is comprised of two superconducting electrodes 40A and 40B, which are separated from one another by a very thin tunnel barrier 42. Barrier 42 is sufficiently thin to allow Josephson tunnelling current therethrough.

In FIG. 5, the bias current $I_B$, timing pulses $I_p(t\pm T)$, and the unknown waveform $I_x(t)$ are all directly coupled to electrode 40B. The monitor gate current $I_M$ is directly coupled to electrode 40A through current limiting resistor R1.

In FIG. 6, the monitor gate 10 is an interferometer comprising two Josephson tunnel junctions J1 and J2, located in a superconducting loop also comprising an inductance L. Again, the signals $I_p$, $I_x$, $I_B$, and the monitor current $I_M$ are all directly coupled to the interferometer 10. Direct coupling of the control currents significantly reduces the crossing inductance $L_c$, and the use of low gain monitor gates provides wide dynamic range and fast response time.

Measurement of Non-Electrical Waveforms (FIGS. 7-10)

The circuit of FIG. 1 can measure not only fast electrical waveforms, but also other types of waveforms such as optical and X-ray waves. Additionally, gamma rays and even certain particle signals, such as a short burst of energetic neutrons, can be measured. In the embodiments of FIGS. 7-10, the monitor gate responds to any general unknown signal which will cause its critical current $I_o$ to be modified in a reversible manner. That is, the intensity of the unknown signal $I_x$ should not cause permanent damage to the monitor gate. With this consideration, the unknown signal $I_x$ could be any of the following:

1. A short duration electromagnetic signal of any frequency, e.g., electrical current, microwave radiation, optical beams, X-rays, gamma rays, or any other photon beam.
2. Short duration phonon beams of any frequency including longitudinal, transverse, bulk, or surface acoustic waves.
3. Short duration particle beams including beams of neutrons, electrons, etc.
4. Any combination of these unknown signals.

The unknown signal may be generated in the cryogenic environment or in any other environment as long as a suitable propagating medium is used to bring a signal to the vicinity of the monitor gate. For example, FIG. 10 will illustrate how an optical beam is propagated from its source through a variable delay line, attenuator, lens, and optical fiber in order to illuminate the monitor gate. In the case of X-rays and gamma rays, an evacuated propagation medium will minimize attenuation of the X-rays or gamma rays.

These unknown signals reduce the critical current $I_0$ of the monitor gate by driving the junction into a non-equilibrium state in which the superconducting gaps are suppressed by pair breaking. W. H. Parker, Phys. Rev. B12, p. 3667 (1975) discusses non-equilibrium superconductivity and how the gap $\Delta$ can be suppressed by pair breaking excitation such as an optical beam. Since the Josephson critical current $I_o$ is directly related to the gap [see V. Ambeguokar and A. Baratoff, Phys. Rev. Lett. 10, 486 (1963), Phys. Rev. Lett. 11, 104 (1963)], Josephson junctions switch to their voltage states in response to pair breaking excitations such as picosecond duration X-ray pulses.

Previously, the reconstruction of electrical waveforms has been described. In that situation, the bias current is easily determined since the total control current is the algebraic sum of the bias current, the sampling pulse current, and the unknown signal current. However, when the monitor gate is to be used to detect other than general electrical signals, a calibration factor is required in order to relate the bias current to the amplitude of the unknown signal. That is, it must be known how the gap of the Josephson device in the monitor gate varies with the input excitation in order to relate the magnitude of $I_B$ to the amplitude of the unknown signal.

Figure 7:
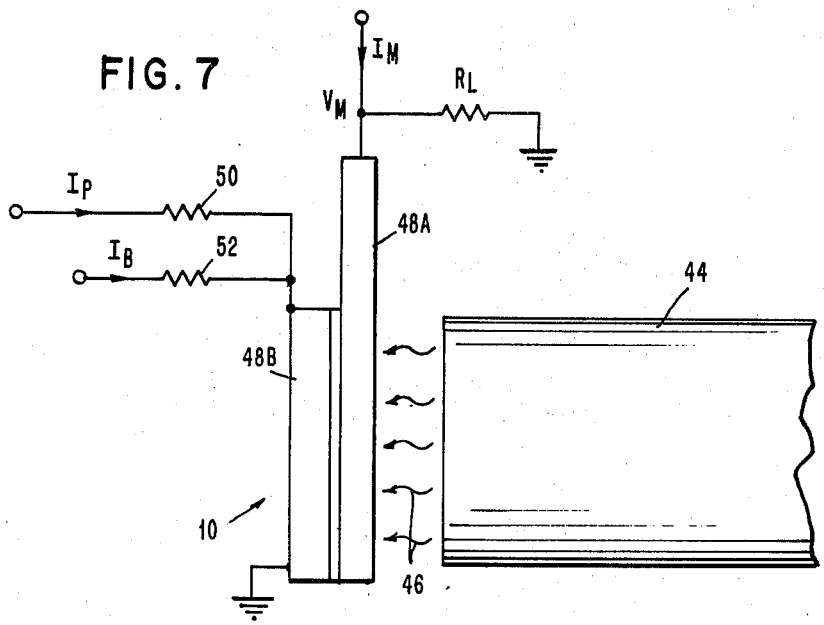
FIG. 7 shows the use of a Josephson device monitor gate in combination with a propagation means for transmitting unknown fast photon beams, such as optical beams, X-ray beams, gamma rays, etc. to the monitor gate.

FIG. 7 shows the use of a suitable propagation medium 44 for delivering the unknown signal $I_x$ to the monitor gate 10. Propagation medium 44 is chosen to readily transmit, without attenuation, optical beams, X-ray beams, gamma rays, etc. The arrows 46 indicate the unknown signal which strikes one electrode 48A of superconducting monitor gate 10. The sub picosecond sampling pulses $I_p$ and the bias current $I_B$ are directly coupled to electrode 48B through the current limiting resistors 50 and 52, respectively. Gate current $I_M$ flows into electrode 48A and the voltage $V_M$ across load resistor $R_L$ is a measure of the state of monitor gate 10.

Figure 8:
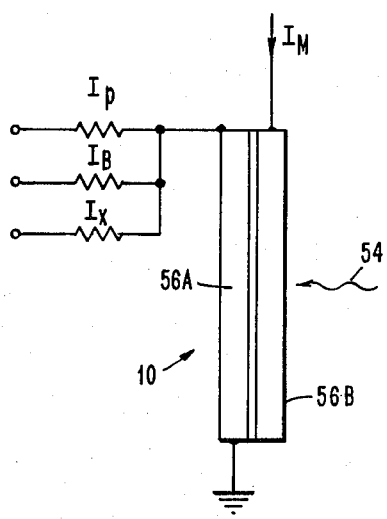
FIGS. 8 and 9 show two electrical configurations for using a single Josephson device monitor gate to reconstruct an input photon beam of unknown amplitude and shape.
Figure 9:
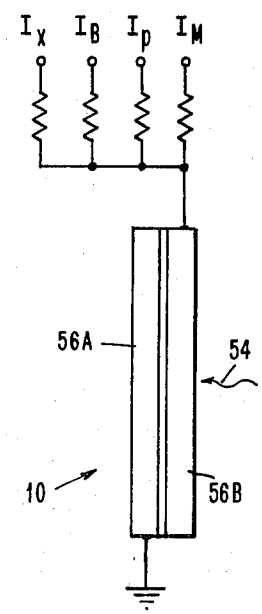

FIGS. 8 and 9 show the use of monitor gate 10 to detect a combination of an unknown electrical signal $I_x$ and an unknown waveform such as a photon beam, represented by the arrow 54. In FIG. 8, the sampling pulse $I_p$, bias current $I_B$, and unknown electrical signal $I_x$ are applied through current limiting resistors to electrode 56A, while unknown beam 54 is incident upon electrode 56B. Gate current $I_M$ is applied directly to electrode 56B of monitor gate 10.

In the operation of the device of FIG. 8, monitor gate 10 directly responds to the unknown input electrical waveform $I_x$, and the bias current $I_B$ depends both on the amplitude of $I_x$ and the amplitude of the unknown input beam 54. If it is known how the gap $\Delta$ of the Josephson device comprising monitor gate 10 varies with the input excitation 54, then $I_B$ can be used to reconstruct the total amplitude of the unknown inputs.

FIG. 9 is similar to FIG. 8, except that all of the electrical currents $I_x$, $I_B$, $I_p$, and $I_M$ are applied through current limiting resistors to electrode 56B of monitor gate 10. This electrode also receives the incident beam 54. Operation of the device of FIG. 9 is the same as that as the device of FIG. 8.

Figure 10:
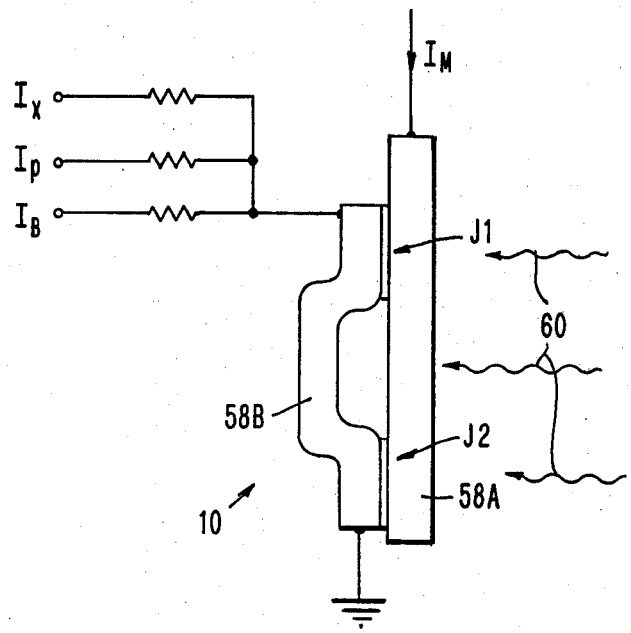
FIG. 10 shows the use of a two Josephson device interferometer for detection of the shape and amplitude of an unknown photon beam.

In FIG. 10, the monitor gate 10 is an interferometer comprising two Josephson junctions J1 and J2. Electrodes 58A and 58B are separated from one another by very small amounts in the areas of junctions J1 and J2 to create two Josephson devices in a manner well known in the art. In this embodiment, electrical waveforms $I_x$, $I_p$, and $I_B$ are applied through appropriate current limiting resistors to electrode 58B, while the unknown beam, represented by arrow 60, is incident upon electrode 58A. This device operates in the same manner as the devices shown in FIGS. 8 and 9.

Figure 11:
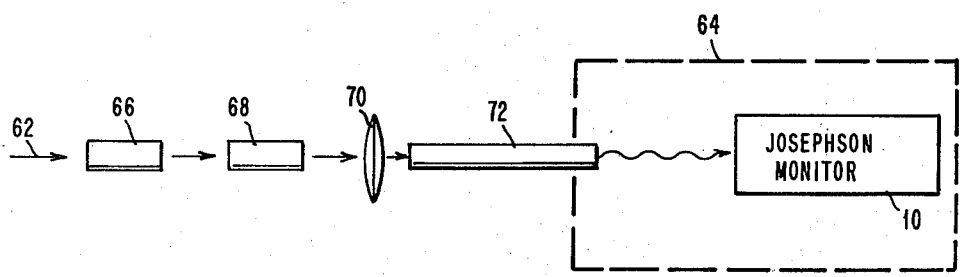
FIG. 11 illustrates how an optical beam can be propagated from a source through a variable delay line, variable attenuator, lens, and optical fiber to illuminate the monitor gate, which is located in a cryogenic environment.

FIG. 11 schematically illustrates how an input photon beam, represented by arrow 62, can be applied to the Josephson monitor gate 10, which is located in a cryogenic environment indicated by the dashed lines 64. In this embodiment, optical beam 62 is propagated from its source through a variable optical delay line 66, a variable attenuator 68, a lens 70, and an optical fiber 72. Fiber 72 enters the cryogenic environment in order to illuminate the monitor gate 11.

The operation of the device of FIG. 10 is identical to that described previously. That is, excess quasi particles are created when the input optical beam (or X-ray beam) breaks Cooper pairs in a superconducting electrode of the Josephson monitor gate 10. The creation of excess quasi particles reduces the critical current $I_o$ of the monitor gate, causing it to switch its voltage state.

The sampling technique described herein is suitable for measuring and reconstructing any of a number of unknown waveforms or particle beams. As such, it has many uses, including measurement and detection uses in the field of non equilibrium superconductivity, where very high speed resolution and excellent sensitivity are required.

It should be noted that the critical Josephson current through the monitor gate can be modified either by an equilibrium mechanism (such as magnetic field switching due to control currents, as illustrated in FIG. 1) or by a pair breaking mechanism in which excess unpaired electrons are produced (for example, by the incidence of an optical beam).

In contrast with Josephson device sampling circuits of the prior art, where either flux is stored in a superconducting loop or where coaxial cables are required to transmit the transition of a Josephson gate to a room temperature sampling oscilloscope, the present technique provides a time reference and noise elimination means so that neither high speed coaxial cables nor flux storage are needed.

That is, unknown signals are measured in the cryogenic environment without the need to carry these signals out of this environment. Further, while the device 16 under investigation, the pulse generator 12 and the monitor gate are in the cryogenic environment, superconductive circuitry can be designed to allow the entire system of FIG. 1 to be in the cryogenic environment.

In this invention, the monitor gate can be made extremely small in order to minimize its resistance and capacitance (and inductance) even though this minimizes the magnitude of the output voltage of the gate. Since the lock-in technique can measure extremely small signal levels, the size of the monitor gate can be minimized to provide the fastest possible switching transition.

In the practice of this invention, a superconducting monitor gate is used, and preferably a Josephson device capable of extremely fast switching speed. Still further, the pulse generator providing the sampling pulses is chosen to be one which will provide the most narrow width pulses, and can include Josephson circuitry. While it will be apparent to those of skill in the art that the provision of the entire circuit enables one to minimize the size of the monitor gate to thereby gain additional advantages, the invention primarily relates to the use of the time referencing means and noise elimination means to provide a Josephson sampling technique having significant improvement and advantages over prior Josephson sampling techniques. Thus, while specific components have been described for use in this invention, it will be appreciated that other possibilities exist for the design of a Josephson sampling circuit using the guidelines expressed herein.

Having thus described my invention, what I claim as new, and desire to secure by Letters Patent is:

1. A sampling system for measuring unknown signals, comprising:

a superconducting monitor gate having at least two distinguishable states to which said unknown signal is applied as a control signal along with a sampling pulse and an adjustable bias signal, switching means for switching the state of said monitor gate, said switching means including a source of said unknown signal, a source of said sampling pulse, and a source of said adjustable bias signal, noise elimination means for unambiguously defining the switching threshold of said monitor gate, said noise elimination means including means for time averaging the voltage state of said monitor gate and being connected in a feedback loop between said source of bias signals and said monitor gate, said means for time averaging including means for applying an error signal to said source of bias signals in order to adjust the amplitude of said bias signal to that exact amplitude which switches the state of said monitor gate, a monitor gate current source for providing current through said monitor gate of a predetermined value, timing means for providing a timing reference and an accurate sampling delay time, said timing means including means for initiating the sampling of said unknown signal by said monitor gate and means for establishing a sampling delay time, said timing means including said source of sample pulses and a delay means for establishing a delay in the application of said sample pulses with respect to the application of said unknown signals, a trigger pulse source for providing trigger pulses to said source of unknown signals and to said source of sampling pulses to initiate the application of said unknown signal to said monitor gate and the application of said sampling pulse to said monitor gate, means for recording the state of said monitor gate at the instance of each said sampling pulse application, said recording means including means relating the magnitude of said bias signal to the magnitude of said unknown signal at each sampling instant.

2. The system of claim 1, further including a first adjustable delay line connected between said trigger pulse source and said source of sampling pulses, and a second delay line connected between said trigger pulse source and said source of unknown signals.

3. The system of claim 1, where said noise elimination means includes a phase sensitive amplifier and a comparator whose output is the error signal that is applied to the source of said bias signal.

4. The system of claim 1, where said monitor gate is comprised of a device exhibiting a Josephson current therethrough, said monitor gate being switchable between distinguishable voltage states by the presence of control signals comprising said unknown signal, said sampling pulse, and said bias signal.

5. The system of claim 4, where said monitor gate is comprised of an interferometer.

6. The system of claim 4, where said control signals are directly coupled to said device exhibiting a Josephson current therethrough.

7. The system of claim 4, where said source of unknown signals, said source of sampling pulses, and said monitor gate are located in a cryogenic environment.

8. The system of claim 4, where at least one of said unknown signals, said sample pulses, and said bias signals is applied as a control current in a conductor located adjacent to said monitor gate.

9. The system of claim 1, where said unknown signal is an optical beam directed onto a superconducting electrode of said monitor gate, said optical beam being of short duration which modifies the switching threshold of said monitor gate.

10. The system of claim 1, where said unknown signal is an electromagnetic signal and said bias signal is an electrical current.

11. The system of claim 1, where said monitor gate is comprised of a single junction exhibiting a Josephson tunnelling current.

12. A Josephson sampling system for measuring unknown signals, comprising:

a superconducting monitor gate comprising a device exhibiting a Josephson tunnelling current, said monitor gate being switchable between two distinguishable states depending upon the incidence of control signals applied thereto and having at least first and second superconducting electrodes separated by a tunnel barrier, a gate current source for providing a gate current to one of the electrodes of said Josephson device, switch means for switching the state of said Josephson device including means for applying said unknown signal to said Josephson device, pulse means for applying sampling pulses to said Josephson device, and bias means for applying a bias current to said Josephson device, said sampling pulse and said bias current being directly coupled to one of the electrodes of said Josephson device while said gate current source is applied to the other electrode of said Josephson device, timing means for triggering the application of said unknown signal and said sampling pulse and for establishing a time interval between application of said sampling pulses, said timing means including a trigger pulse source for applying trigger pulses to said pulse means and to said means for applying said unknown signals, and further including delay means for delaying the application of said sample pulses with respect to said unknown signal in order to sample said unknown signal at preselected intervals of time, noise elimination means for eliminating the effects of noise and random events on the switching of said Josephson device in order to unambiguously define the switching threshold of said Josephson device in response to the combination of the control signals supplied by said unknown signal, said sampling pulses, and said bias current, said noise elimination means including means for developing an error signal representative of the deviation of the voltage read across one of the electrodes of said Josephson device with a reference voltage, and means for applying said error signal to said bias means to adjust the magnitude of said bias current to be that which, when combined with the magnitude of said sampling pulse and the magnitude of said unknown signal, will meet the threshold required for switching said Josephson device to one of its voltage states, said gate current through said Josephson device being held constant during any interval of time in which said sampling pulse is applied as a control input to said Josephson device, means including said trigger pulse source, said pulse means, and said delay means for providing repetitive sampling pulses to said Josephson device at the same instant of time relative to the unknown signal in order to time average said error signal over many cycles of sampling in order to eliminate effects on said Josephson device other than the switching effects produced by the simultaneous presence of said unknown signal, said sampling pulse, and said bias current.

13. The system of claim 12, where said Josephson device is comprised of a single tunnel junction including first and second superconducting electrodes and a tunnel barrier located therebetween.

14. The system of claim 12, wherein said noise elimination means includes a phase sensitive detector for comparing the voltage across one said Josephson device with a reference signal of the same phase, and a comparator means for developing an error signal representative of the difference between said voltage across said Josephson device and said reference voltage, and for applying said error signal to said bias means in order to vary said bias current.

15. The system of claim 12, including a recording means for representing said unknown signal in direct proportion to said bias current.

16. The system of claim 12, wherein said unknown signal is any electromagnetic signal of short duration which modifies the critical Josephson current by either an equilibrium mechanism or by the mechanism of pair breaking.

17. The system of claim 12, in which said unknown signal is an electromagnetic wave incident upon a superconducting electrode of said monitor gate.

18. The system of claim 12, where said unknown signal is a phonon beam of short duration, which modifies the Josephson switching threshold by the mechanism of pair breaking.

19. The system of claim 12, where said unknown signal is a particle beam of short duration, which modifies the Josephson switching threshold by the mechanism of pair breaking.

20. The system of claim 12, wherein said gate current through said Josephson device has a constant magnitude at any sampling time, and the algebraic sum of the amplitudes of said bias current, said sample pulse, and said unknown signal is equal to the amplitude of the switching threshold of said Josephson device for said constant amplitude of gate current therethrough.

* * * * *